United States Patent [19]

Smith, Jr.

[11] Patent Number: 5,265,042
[45] Date of Patent: Nov. 23, 1993

[54] DEVICE AND METHOD FOR A NONLINEAR COMB FILTER

[75] Inventor: Wayne E. Smith, Jr., Columbia, Md.

[73] Assignee: The United States of America Government as represented by the Director, National Security Agency, Fort George G. Meade, Md.

[21] Appl. No.: 932,532

[22] Filed: Aug. 20, 1992

[51] Int. Cl.$^5$ .............................................. G06F 15/31
[52] U.S. Cl. .......................... 364/724.07; 364/724.01
[58] Field of Search ...................... 364/724.07, 724.01, 364/715.01

[56] References Cited

U.S. PATENT DOCUMENTS

| | | | |
|---|---|---|---|
| 4,344,150 | 8/1982 | McLaughlin | 364/724.07 |
| 4,672,567 | 6/1987 | Kelly et al. | 364/724.01 |
| 4,724,395 | 2/1988 | Freeman | 328/151 |
| 4,928,258 | 5/1990 | May | 364/724.17 |
| 4,951,242 | 8/1990 | Hobson | 364/715.01 |
| 5,138,567 | 8/1992 | Mehrgardt | 364/724.01 |

OTHER PUBLICATIONS

Narendra, "A Separable Median Filter For Image Noise Smoothing" *IEEE Trans. on Pattern Analysis and Machine Intelligence* vol. PAMI-3, No. 1, Jan. 1981, pp. 20-29.
Elliott, "Adaptive Cancellation of Periodic, Synchronously Sampled Interfence" *IEEE Trans. on Acoustics, Speech & Signal Processing* vol. ASSP-33 No. 3 Jun. 1985, pp. 715-717.
Wang, "Adaptive Harmonic Noise Cancellation with an Application to Distribution Power Line Communications" *IEEE Trans. on Communications*, vol. 36, No. 7 Jul. 1988.
Astola et al, "On Computation of the Running Median" *IEEE Trans. on Acoustics, Speech & Signal Processing* vol. 37 No. 4 Apr. 1989, pp. 572-574.
Nehorai, "Adaptive Comb Filtering For Harmonic Signal Enhancement" *ICASSP 85*, 1985, pp. 335-338.
Longhotham et al, "Theory of Order Statistic Filters & Their Relationship to Linear FIR Filters" *IEEE Trans. on Acoustics, Speech & Signal Processing*, vol. 37, No. 2, Feb. 1989, pp. 275-277.

*Primary Examiner*—David H. Malzahn
*Attorney, Agent, or Firm*—Robert D. Morelli; Thomas O. Maser; John R. Utermohle

[57] ABSTRACT

This invention describes a nonlinear comb filter device and a method for removing harmonic interference from a corrupted signal. Here, a corrupted signal is defined as a signal containing an impulsive signal and harmonic interference. The corrupted signal is delayed through a delay line. The delay line has a plurality of tapped output terminals each spaced at a delay time that is a multiple of the fundamental period of the harmonic interference. An odd number of taps is preferred for ease of sampling and ease of performing certain nonlinear functions such as a median. Each delay line tap is connected to a corresponding input to a nonlinear device. A median device is one possible embodiment of a nonlinear device. The delay line and the nonlinear device extract the harmonic interference from the corrupted signal. The corrupted signal is synchronized with the extracted harmonic interference by tapping the corrupted signal off of the delay line at a delay that is equal to the average delay of the delay line and the nonlinear device. The extracted harmonic interference is then subtracted from the synchronized corrupted-signal in order to produce the impulsive signal of interest.

8 Claims, 8 Drawing Sheets

DEVICE AND METHOD FOR A NONLINEAR COMB FILTER

BACKGROUND OF THE INVENTION

1. Field of Invention

This invention relates to a device and method for realizing the function of a nonlinear comb filter and, more particularly, to a device and method for realizing the function of a median comb filter for filtering harmonic interference from a transient or impulsive signal o interest.

2. Description of Related Art

Interference (i.e., noise) has typically been removed from signals by using linear filters, but linear filters tend to introduce artifacts or noise when the signal of interest is either a transient signal or an impulsive signal. For example, a low pass filter used on a speech signal will filter out high frequency noise along with important high frequency speech components. The result is a distorted speech signal.

A particularly troublesome noise problem is created by interference from power line systems that corrupt impulsive signals (as oppossed to periodic signals). Power line systems typically transmit energy at some fundamental frequency (e.g. 60 Hz). The interference signal created by a power line system typically consists of harmonic frequencies of this fundamental frequency. These harmonic frequencies are multiples of the fundamental frequency of the trasmitted signal (e.g., 60 Hz, 120 Hz, 180 Hz, 240 Hz, etc.). Such interference is known as harmonic interference.

The conventional way to reject or reduce harmonic interference is to use some form of linear filter such as a notch filter or comb filter. As the bandwidth of the linear filter narrows, the non-negligible portion of the impulse response grows longer in time. This fundamental property applies to all linear filters (i.e., bandpass, notch, highpass, lowpass, etc.). Consequently, any linear filter will have a non-negligible impulse response resulting in echo-like artifacts when a transient (i.e., impulsive) signal is processed. Another way of stating this is that narrowband linear filters will "ring" when hit by an impulsive signal.

The "ringing" (or echos) produced by linear notch filters and linear comb filters appear as replicas of the impulsive signal but with decreasing amplitude at intervals equal to the fundamental period of the interference signal being filtered out (i.e., at every 0.01667 sec. for a signal with a fundamental frequency of 60 Hz).

Nonlinear devices (such as median devices) are useful for preserving monotonic trends (i.e., non-impulse trends) and steps within a signal However, nonlinear functions (such as the median) by themselves do not remove harmonic interference.

The median filter was introduced by J. W. Tukey in *Exploratory Data Analysis*, Addison Wesly, 1971. The median filter consists of a tapped delay line connected to a median device. The basic idea is to slide a fixed length sampling window across the input data. At each sample point, a median function is performed on the values that are currently within the sampling window. The median filter is useful for removing noise spikes within monotonic (non-impulsive) signals while leaving the monolithic steps unaffected.

For example, a signal stream may consist of the values - 3 4 10 3 5 15 16 14 12 -. The dash (i.e., "-") represents an unknown value. Using a delay line with three taps, the following samples would be presented to the three-input median device: (- - 3), (- 3 4), (3 4 10), (4 10 3), (10 3 5), (3 5 15), (5 15 16), (15 16 14), (16 14 12), (14 12 -), and (12 - -). The median filter would produce the following output signal: - - 4 4 5 5 15 15 14 - - . Notice that the impulsive signal (10) was removed while the step (5 to 15) was preserved.

In "A Separable Median Filter for Image Noise Smoothing", a published article by Patrenahalli M. Narendra in *IEEE Transactions on Pattern Analysis and Machine Intelligence*, Vol. PAMI-3, No. 1 Jan. 1981, pp. 20–29 it was pointed out that a median filter is more effective than a linear filter in smoothing out noise in image signals In "Adaptive Cancellation of Periodic, Synchronously Sampled Interference", a published article by S. J. Elliott and P. Darlington in *IEEE Transactions on Acoustics, Speech, and Signal Processing*, Vol. ASSP-33, No. 3, Jun. 1985, pp. 715–717 harmonic interference is synchronously sampled and linearly summed to cancel noise using a linear comb filter The samples were required to be spaced at exact multiples of the fundamental frequency of the interference signal In "Adaptive Harmonic Noise Cancellation with an Application to Distributed Power Line Communications", a published article by Jin-Der Wang and H. Joel Trussell in *IEEE Transactions on Communications*, Vol. 36, No. 7, Jul. 1988, pp. 875–883 it was indicated that serious problems exist in power line distribution systems due to drifting power line frequency and harmonic bandwidth. It was mentioned that systems that use fixed filters cannot take variations in harmonic noise into account but that adaptive filters could. Adaptive filters have previously been used to cancel noise but this paper showed that they could also be used to cancel harmonic noise. Adaptive filters have two inputs. One input is used for the noise-corrupted signal The other input is used for the reference signal The reference signal is made up of samples of the corrupted signal. The samples are taken at integral multiples of the power line fundamental frequency. Adaptive algorithms adjust the taps of the filter in order to predict the noise in the corrupted signal. The predicted noise is then subtracted from the corrupted signal in order to cancel the noise. Harmonic noise tends to occur at multiples of the power line fundamental frequency (e.g., 60 Hz). The frequency of harmonic noise also varies as the power line fundamental frequency varies This paper proposed a solution to this problem by using a linear comb filter embodied in a finite impulse response (FIR) filter as the adaptive filter.

In "On Computation of the Running Median", a published article by Jaakko T. Astola and T. George Campbell in *IEEE Transactions on Acoustics, Speech, and Signal Processing*, Vol. 37, No. 4, Apr. 1989, pp. 572–574 it was mentioned that digital filters could be used to process signals in the time or frequency domain. Digital filtering has been accomplished by linear filters which tend to distort abrupt changes in signals. Linear filters are also not able to remove impulsive noise totally. Median filters have been used to get around these problems. A continuously sampled or running median filter was proposed to get an unbiased estimate of a signal of interest.

In U.S. Pat. No. 4,928,258, entitled "Recursive Median Filtering", a device was disclosed that performs the function of a median filter in a new way (i.e., recursively). This invention is solely a new way of doing the nonlinear median function. The present invention relates to using a median filter within a comb filter structure in order to realize a nonlinear comb filter.

In U.S. Pat. No. 4,724,395, entitled "Median Filter for Reconstructing Missing Color Samples", a device was described that utilizes a median filter to process image signals. This invention does not describe the use of a median filter within a comb filter structure as the present invention does.

SUMMARY OF THE INVENTION

It is an object of this invention to reject harmonic interference that has corrupted an impulsive signal of interest.

It is another object of this invention to reduce harmonic interference that has corrupted an impulsive signal of interest.

It is another object of this invention to use a nonlinear comb filter to reject harmonic interference that has corrupted an impulsive signal of interest.

It is another object of this invention to use a nonlinear comb filter to reduce harmonic interference that has corrupted an impulsive signal of interest.

It is another object of this invention to use a median comb filter to reject harmonic interference that has corrupted an impulsive signal of interest.

It is another object of this invention to use a median comb filter to reduce harmonic interference that has corrupted an impulsive signal of interest.

These objects are achieved by using a nonlinear comb filter such as a median comb filter to reject or reduce harmonic interference that has corrupted an impulsive signal of interest The corrupted signal includes the impulsive signal of interest plus harmonic interference. The nonlinear comb filter extracts the harmonic interference and then subtracts it from a synchronized form of the corrupted signal in order to obtain the impulsive signal of interest.

The method is to continuously compute a nonlinear function such as a median upon samples of the corrupted signal. A delay line is used to sample the corrupted signal. The samples are spaced at multiples of the fundamental period of the harmonic interference (e.g., spaced every 0.0167 sec. for harmonic interference with a fundamental frequency of 60 Hz). The harmonic interference is extracted from the corrupted signal. The corrupted signal synchronized with the extracted harmonic interference by tapping the corrupted signal off of the delay line at a tap that has a delay equal to the average delay through the delay line and the nonlinear device (which is typically the center tap). These steps are repeated so that harmonic interference is continuously being removed from the corrupted signal in order to obtain the impulsive signal of interest.

The present invention combines a nonlinear device (particularly the median device) with a comb filter structure to solve the problem of distortion free removal of harmonic interference from impulsive signals. Linear filters, linear comb filters, and nonlinear filters (including median filters) have been used for some time but have not been able to solve this problem.

DESCRIPTION OF PREFERRED EMBODIMENTS

The present invention describes a nonlinear comb filter device and method of rejecting harmonic interference that corrupts impulsive signals.

Figure 1:
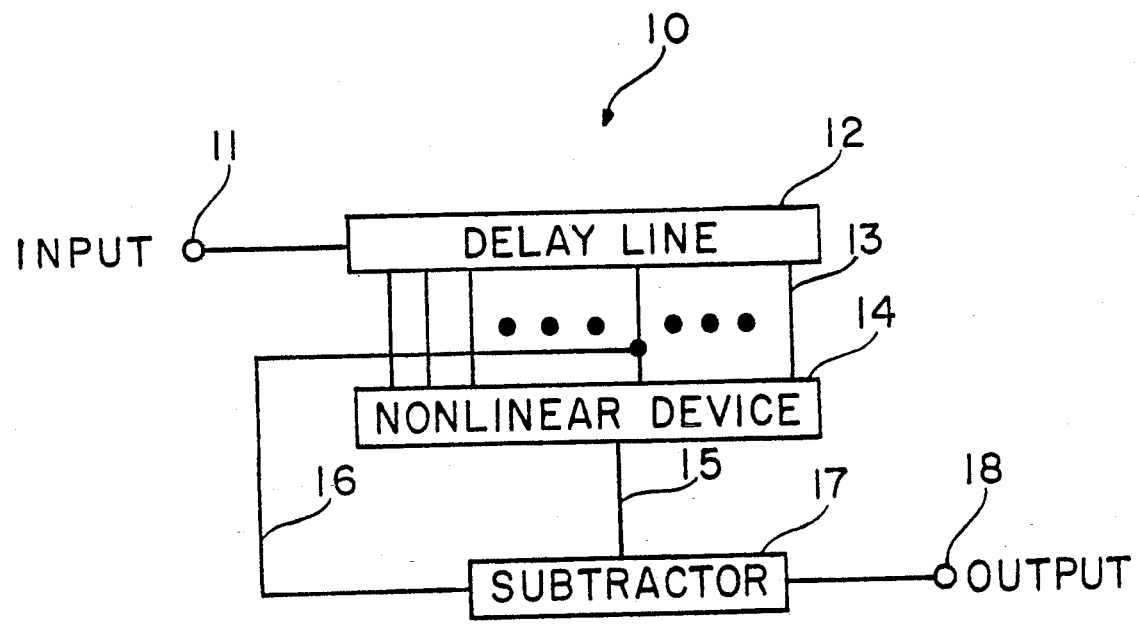
FIG. 1 is a schematic of a nonlinear comb filter.

FIG. 1 shows the schematic for a nonlinear comb filter 10. A , corrupted signal is applied to the input 11. The corrupted signal is typically made up of an impulsive signal of interest and harmonic interference. The corrupted impulsive-signal is then transmitted along a tapped delay line 12 in order to extract the harmonic interference.

The tapped delay line 12, is tapped 13 at delay times that represent multiples of the fundamental period of the harmonic interference. For example, if the fundamental frequency of the harmonic interference is 60 Hz, as is typical for power line systems, the delay line will be tapped so that the taps represent periods of 1/(60 Hz), 2/(60 Hz), 3/(60 Hz) etc.. The taps will then correspond to delay times of 0.0167 sec., 0.0333 sec., 0.050 sec. etc.

The tapped delay line 12 has numerous taps 13 which are used to extract the harmonic interference from the corrupted signal. The number of taps 13 can be even or odd. The preferred embodiment uses an odd number of taps 13.

Typically, the tapped delay line 12 will have a relatively small number of taps (e.g., five to nine). A longer delay line 12 with more taps 13 can provide better filter performance, but will require more precise knowledge of the harmonic interference fundamental frequency and will not accomodate as much frequency variation (i.e., jitter) in the harmonic interference signal. An increase in both the length of the delay line 12 and the number of taps 13 results in a narrower (or sharper) harmonic rejection bandwidth. If the harmonic interference is stable, the tapped delay line 12 could have hundreds of taps, but calculating the nonlinear function (such as a median) with that many inputs may be computationally prohibitive.

The taps 13 from the tapped delay line 12 are connected to the inputs of a nonlinear device 14. The delay line 12 and the nonlinear device 14 form a nonlinear filter which is used to extract the harmonic interference from the corrupted signal. The use of a nonlinear device 14 within in a comb filter structure 10 differs from prior approaches which used a linear device instead.

By spacing the taps 13 of the delay line 12 at multiples of the fundamental period of the harmonic interference the samples presented to the inputs of the nonlinear device 14 are dominated by the harmonic interference and the impulsive signal of interest appears to be the unwanted transient component. The nonlinear device 14 will reject the impulsive signal of interest and leave the harmonic interference unaffected. The harmonic interference will then appear at the output 15 of the nonlinear device 14.

At the same time that the corrupted signal is being delayed by the delay line 12 and then applied to the inputs of the nonlinear device 14, the corrupted signal is also applied to the input 16 of a subtractor 17. The corrupted signal applied to the input 16 of the subtractor 17 is synchronized to the extracted harmonic interference that appears at the output 15 of the nonlinear device 14. Synchronization is accomplished by delaying the corrupted signal by the average delay of the corrupted signal as processed by the delay line 12 and the nonlinear device 14. Typically, synchronization is achieved by connecting the input 16 of the subtractor 17 to the center tap of the delay line 12.

The subtractor 17 subtracts the extracted harmonic interference appearing at the output 15 of the nonlinear device 14 from the synchronized corrupted signal appearing at the input 16 of the subtractor 17. The result is to have the impulsive signal of interest appear at the output 18 of the subtractor 1 and nonlinear comb filter 10. This process is carried on continuously so that the output 18 of the nonlinear comb filter 10 is a running nonlinear function of the extracted harmonic interference subtracted from the corrupted signal in order to produce the impulsive signal of interest.

Figure 2:
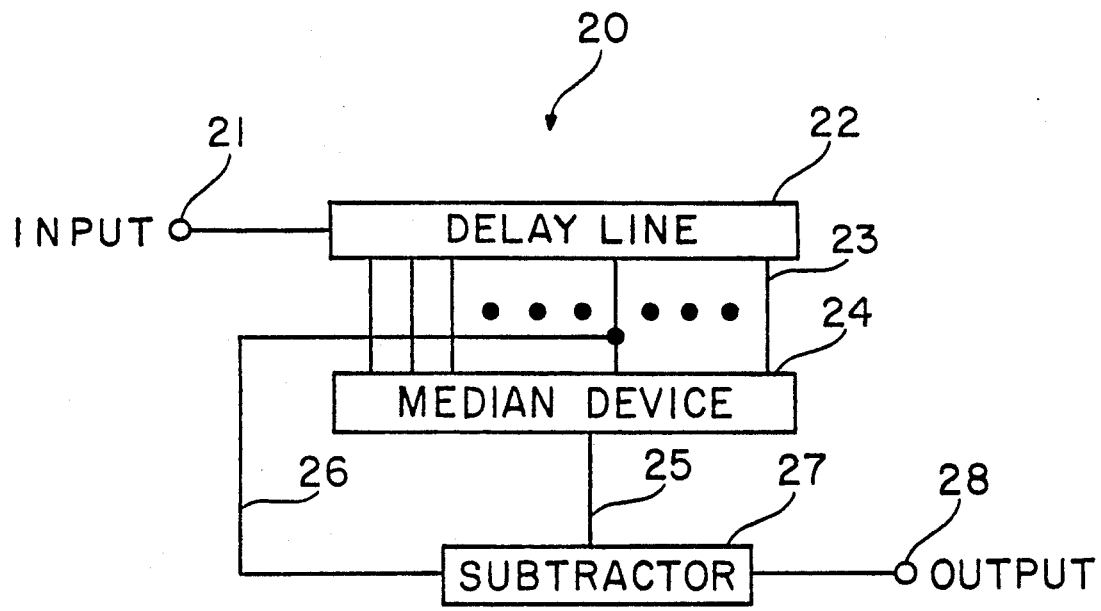
FIG. 2 schematic of a median comb filter.

The preferred embodiment of the nonlinear comb filter 10 of FIG. 1 is the median comb filter 20 of FIG. 2. The only difference between the schematic of FIG. 2 and the schematic of FIG. 1 is that the nonlinear device 14 in FIG. 1 is replaced in FIG. with a median device 24.

A median device outputs the median of the data presented at its input terminals. For example, if (1 5 2), (8 4 3), and (9 6 12) are three different samples presented to the input terminals to a three-input median device, a signal consisting of 2, 4, and 9 respectively would appear at the output terminal of the median device.

Except for the use of a median device 24, the description and reasoning is identical to the nonlinear comb filter of FIG. 1. A corrupted signal is applied to the input 21 of the median comb filter 20. The corrupted signal is then transmitted along a tapped delay line 22. The delay line 22, is tapped 23 at delay times that correspond to delays that are equal to multiples of the fundamental period of the harmonic interference.

The tapped delay line 22 has numerous taps 23 which are used to extract the harmonic interference from the corrupted signal. The number of taps 23 can be even or odd. The preferred embodiment uses an odd number of taps 23. The odd number of taps 23 also makes it easier to compute a median which is used to determine the middle value of a group of values (e.g., the median of three samples with values 3, 20, and 100 is 20, while the median of four samples may not be one of the sample values).

Typically, the tapped delay line 22 will have a relatively small number of taps (e.g., five to nine). A longer delay line 22 with more taps 23 can provide better filter performance, but will require more precise knowledge of the harmonic interference fundamental frequency and will not accomodate as much frequency variation (i.e., jitter) in the harmonic interference signal. An increase in both the length of the delay line 22 and the number of taps 23 results in a narrower (or sharper) harmonic rejection bandwidth. If the harmonic interference is stable, the tapped delay line 22 could have hundreds of taps 23, but calculating the median with that many inputs may be computationally prohibitive.

The taps 23 from the tapped delay line 22 are connected to the inputs of a median device 24. The delay line 22 and the median device 24 form a median filter which is used to extract the harmonic interference from the corrupted signal.

By spacing the taps 23 of the delay line 22 at multiples of the fundamental period of the harmonic interference the samples presented to the inputs of the median device 24 are dominated by the harmonic interference and the impulsive signal of interest appears to be the unwanted transient component. The median device 24 will reject the impulsive signal of interest and leave the harmonic interference unaffected. The harmonic interference will then appear at the output 25 of the median device 24.

At the same time that the corrupted signal is being delayed by the delay line 22 and then applied to the inputs of the median device 24, the corrupted signal is also applied to the input 26 of a subtractor 27. The corrupted signal applied to the input 26 of the subtractor 27 is synchronized to the extracted harmonic interference that appears at the output 25 of the median device 24. Synchronization is accomplished by delaying the corrupted signal by the average delay of the corrupted signal as processed by the delay line 22 and the median device 24. Typically, synchronization is achieved by connecting the input 26 of the subtractor 27 to the center tap of the delay line 22.

The subtractor 27 subtracts the extracted harmonic interference appearing at the output 25 of the nonlinear device 24 from the synchronized corrupted signal appearing at the input 2 of the subtractor 27. The result is to have the impulsive signal of interest appear at the output 28 of the subtractor 27 and median comb filter 20. This process is carried on continuously so that the output 28 of the median comb filter 20 is a running median function of the extracted harmonic interference subtracted from the corrupted signal in order to produce the impulsive signal of interest.

The signal plots of FIGS. 3, 4, 5, 6, and 7 illustrate the operation of conventional linear comb filters. The signal plot of FIG. 8 illustrates the operation of a median comb filter.

Figure 3:
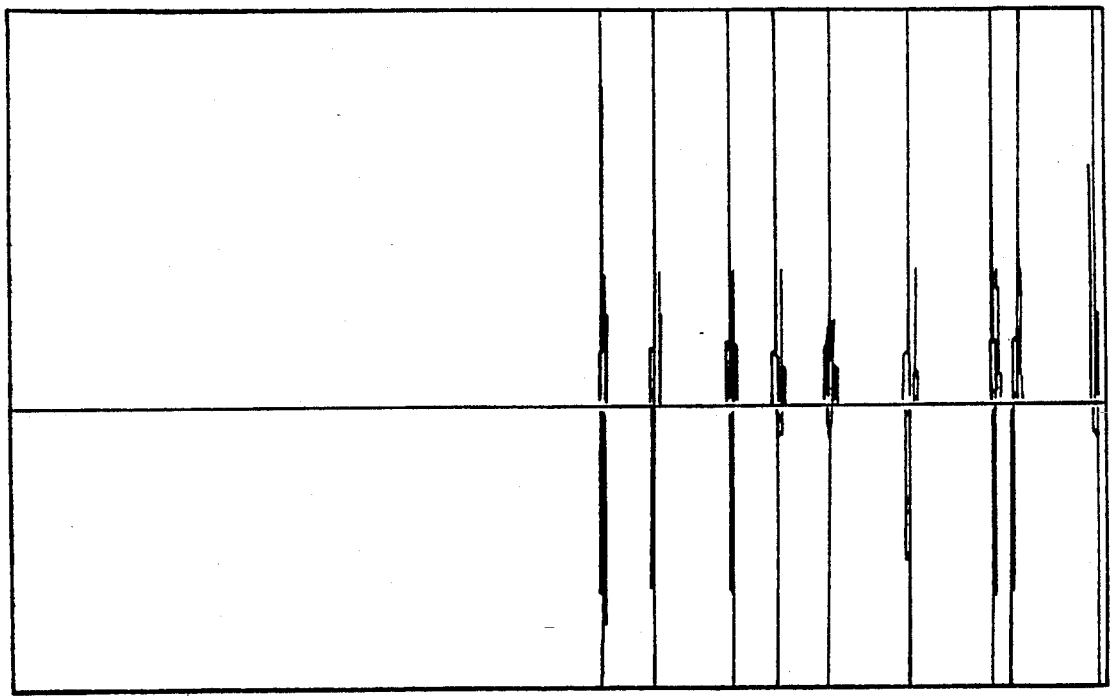
FIG. 3 is a plot of an impulsive signal of interest.
Figure 4:
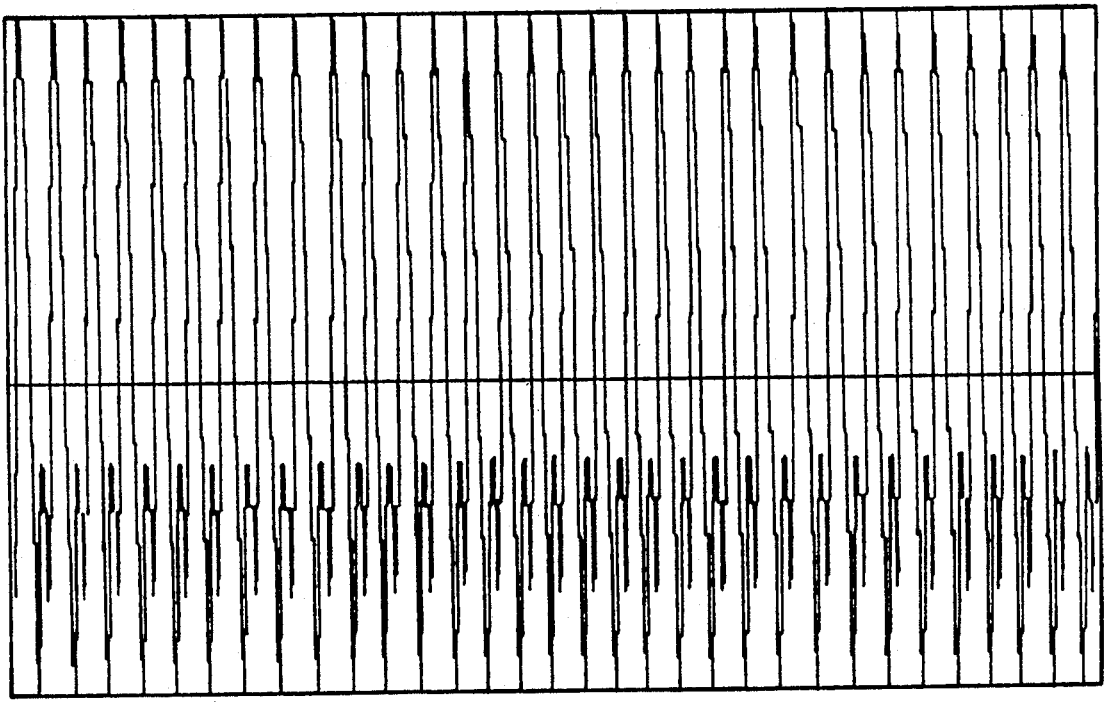
FIG. 4 is a plot of a harmonic interference signal.
Figure 5:
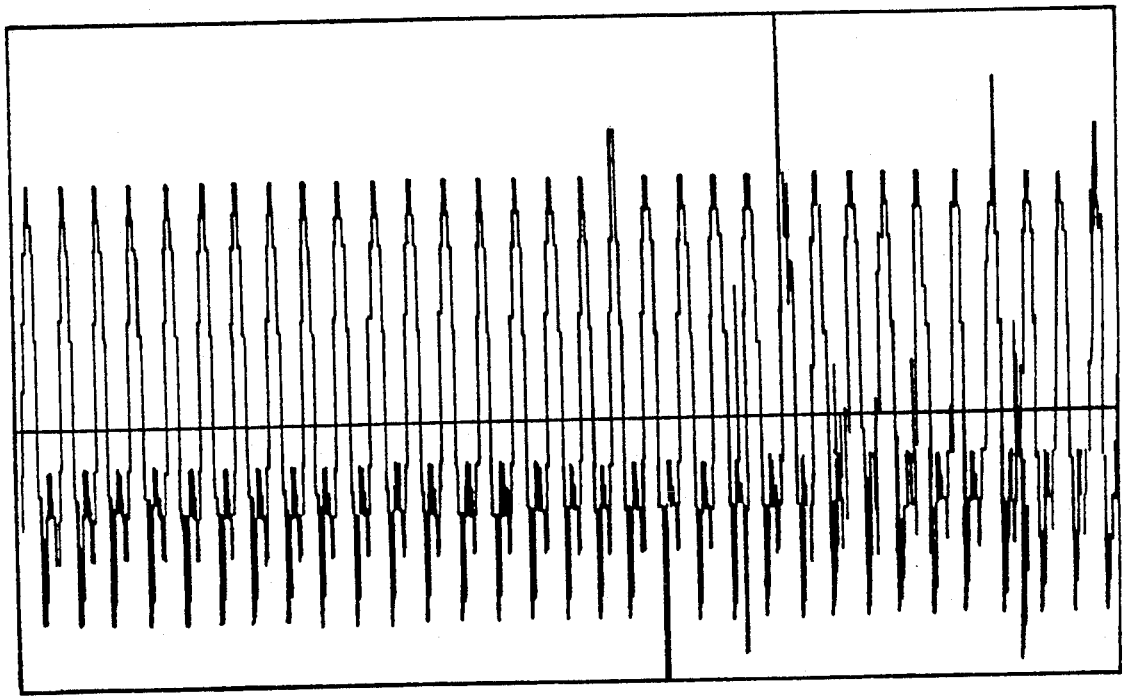
FIG. 5 is a plot of the impulsive signal of interest of FIG. 3 which has been corrupted by the harmonic interference of FIG. 4.

FIG. 3 shows the uncorrupted impulsive signal of interest. FIG. 4 shows the harmonic interference. In FIG. 4, the harmonic interference is shown having a fundamental period of 32 samples. FIG. 5 shows the corrupted signal which consists of the harmonic interference of FIG. 4 added to the impulsive signal of interest of FIG. 3.

Figure 6:
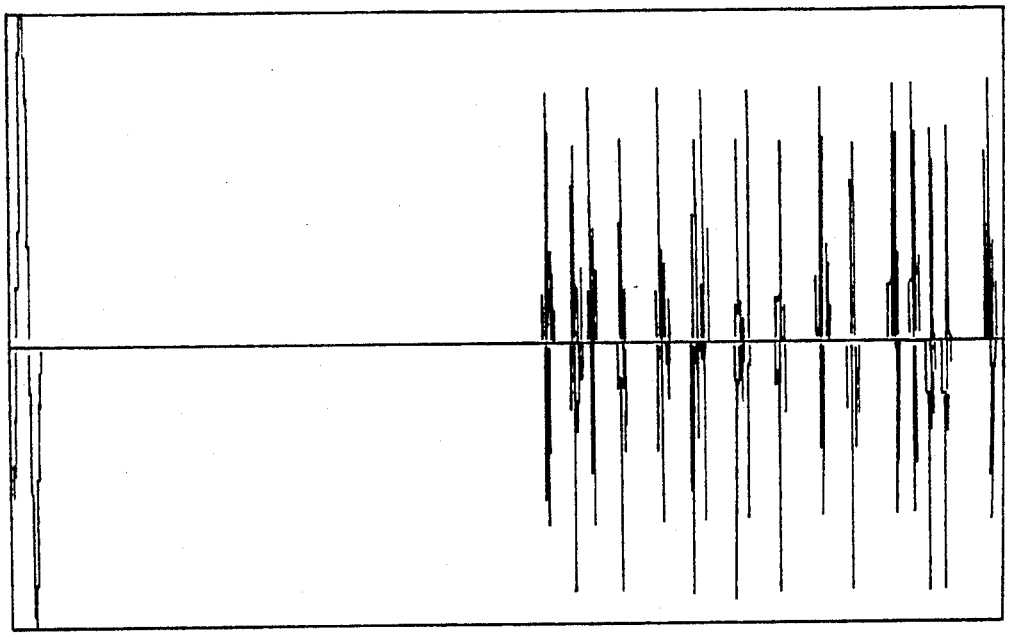
FIG. 6 is a plot of the corrupted signal of FIG. 5 after being processed by a non-recursive linear comb filter.

FIG. 6 illustrates the application of a non-recursive linear comb filter to the corrupted of FIG. 5. FIG. 6 shows that a non-recursive linear comb filter successfully filters the harmonic interference after a 32-sample initial region. The impulsive signal of interest, however, is distorted by the addition of delayed negative images Therefore non-recursive linear comb filters are not effective for removing harmonic interference in order to obtain an impuse signal of interest.

Figure 7:
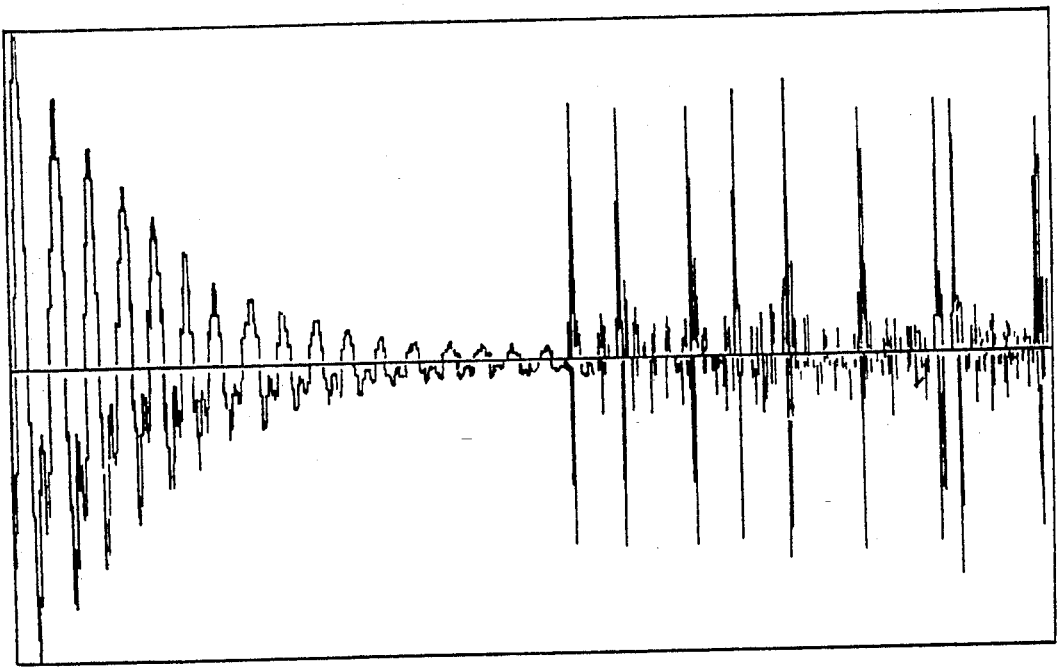
FIG. 7 is a plot of the corrupted signal of FIG. 5 after being processed by a recursive linear comb filter.
Figure 8:
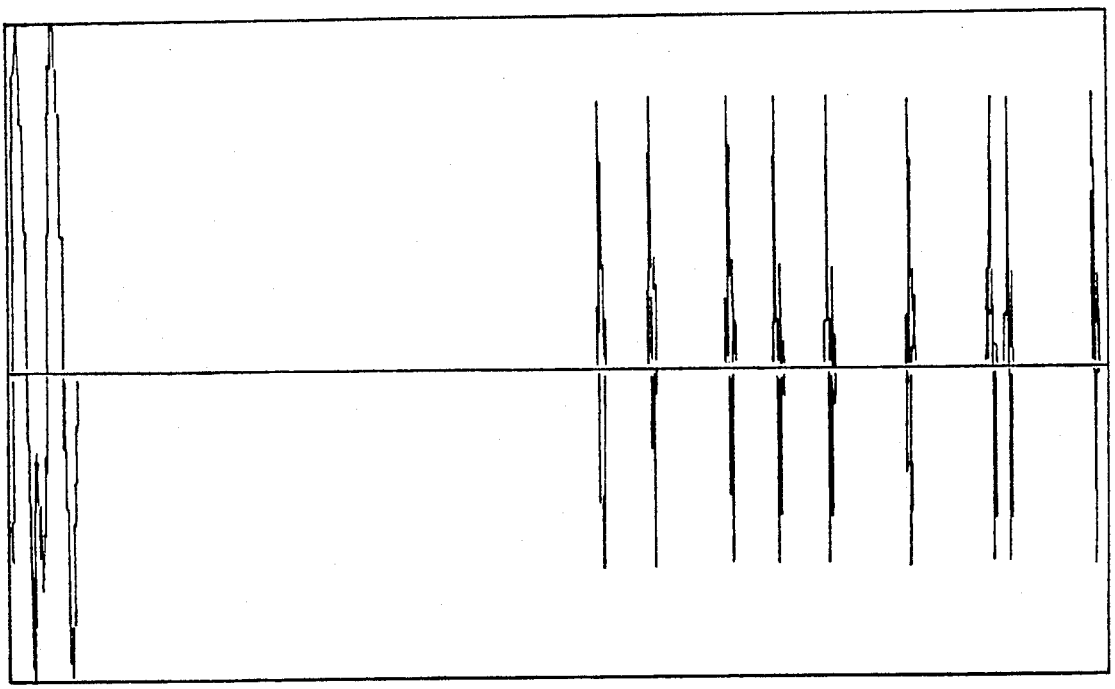
FIG. 8 is a plot of the corrupted signal of FIG. 5 after being processed by a median comb filter.

FIG. 7 illustrates the application of a recursive linear comb filter to the corrupted signal of FIG. 5. The initial settling period, in this case, is longer than for the non-recursive filter shown in FIG. 6. The impulsive signal of interest is still distorted by the addition of delayed negative images which decay exponentially and interfere with successive impulsive signals of interest. This filter is likewise not effective.

FIG. 8 illustrates the application of a median comb filter to the corrupted signal of FIG. 5. It shows that the harmonic interference is removed after an initial region corresponding to the median comb filter delay line length. The plot of FIG. 8 was obtained using a five-tap median device with the taps spaced 32 samples apart.

Because of the nonlinear effect that the median comb filter has on sinusoidal signals at other than the frequency of the harmonic interference, the median comb filter is only suitable for filtering harmonic interference that has corrupted impulsive signals. Steady-state sinusoidal signals will be distorted by a median comb filter.

The present invention describes a new device that uses a nonlinear device within a comb filter structure. The present invention solves the problem of removing harmonic interference from an impulsive signal. Previous methods of using linear filters, linear comb filters, and median filters have not been able to solve this problem. The present invention, which was illustrated using a power line system, is also useful where the impulsive signal of interest is weak and transient in nature and the harmonic interference dominates (e.g., laboratory test equipment, electrocardiogram equipment (EKG), electromylogram equipment (EMG), and electroencephalogram equipment (EEG)).

Changes and modifications in the specifically described embodiment can be carried out without departing from the scope of the invention which is intended to be limited only by the scope of the appended claims.

What is claimed is:

1. A nonlinear comb filter device for removing harmonic interference from an impulsive signal comprising:
   (a) a delay line for receiving a corrupted signal comprising an impulsive signal of interest and harmonic interference, said delay line having an input terminal and a plurality of tapped output terminals each spaced at a delay equal to a multiple of the fundamental period of the harmonic interference;
   (b) a nonlinear device for extracting the harmonic interference from the corrupted signal, said nonlinear device having a plurality of input terminals each connected to a respective one of said tapped output terminals of said delay line and an output terminal; and
   (c) a means for subtracting the signal at the output of said nonlinear device from the corrupted signal so that the signal of interest appears at the output of said means for subtracting, said means for subtracting having a first input connected to the output terminal of said nonlinear device and a second input connected to one of said plurality of delay line taps that represents the average delay of the corrupted signal through said delay line and said nonlinear device so that the signals appearing at said first and second inputs are synchronized.

2. The device of claim 1 wherein said nonlinear device is a a median device.

3. The device of claim 1 wherein said delay line has an odd number of tapped output terminals each spaced at a delay equal to a multiple of the fundamental period of the harmonic interference.

4. A device of claim 3 wherein said nonlinear device is a median device.

5. A method of removing harmonic interference from an impulsive signal comprising the steps of:
   (a) delaying a corrupted signal comprising an impulsive signal of interest and harmonic interference at a plurality of intervals each a multiple of the fundamental period of the harmonic interference;
   (b) extracting the harmonic interference from the corrupted signal by performing a nonlinear function on the delayed signal of step (a);
   (c) synchronizing the corrupted signal with the harmonic interference of step (b); and
   (d) subtracting the harmonic interference of step (b) from the synchronized signal of step (c) so that the impulsive signal of interest results.

6. The method of claim 5 wherein said step of extracting the harmonic interference from the corrupted signal by performing a nonlinear function is accomplished by extracting the harmonic interference from the corrupted signal by performing a median function.

7. The method of claim 5 wherein said step of delaying a corrupted signal is accomplished by delaying a corrupted signal at an odd number of intervals each a multiple of the fundamental period of the harmonic interference.

8. The method of claim 7 wherein said step of extracting the harmonic interference from the corrupted signal by performing a nonlinear function is accomplished by extracting the harmonic interference from the corrupted signal by performing a median function.

* * * * *